United States Patent
Bellas et al.

(10) Patent No.: US 7,305,649 B2
(45) Date of Patent: Dec. 4, 2007

(54) AUTOMATIC GENERATION OF A STREAMING PROCESSOR CIRCUIT

(75) Inventors: Nikos Bellas, Chicago, IL (US); Sek M. Chai, Streamwood, IL (US); Erica M. Lau, Schaumburg, IL (US); Zhiyuan Li, Lake Zurich, IL (US); Daniel A. Linzmeier, Wheeling, IL (US)

(73) Assignee: Motorola, Inc., Schaumburg, IL (US)

( * ) Notice: Subject to any disclaimer, the term of this patent is extended or adjusted under 35 U.S.C. 154(b) by 73 days.

(21) Appl. No.: 11/109,915

(22) Filed: Apr. 20, 2005

(65) Prior Publication Data

US 2006/0242617 A1     Oct. 26, 2006

(51) Int. Cl.
    *G06F 17/50*    (2006.01)
    *G06F 15/00*    (2006.01)
    *H03K 19/00*    (2006.01)

(52) U.S. Cl. ............................. 716/17; 716/16; 716/18; 712/7; 712/18; 712/36; 712/245

(58) Field of Classification Search .................. 716/16, 716/17, 18; 703/13, 14; 713/100, 189; 712/7, 712/18, 20, 36, 245; 714/1, 36, 733; 717/132, 717/156, 161; 345/505, 557, 606
    See application file for complete search history.

(56) References Cited

U.S. PATENT DOCUMENTS

| | | | | |
|---|---|---|---|---|
| 5,535,319 A * | 7/1996 | Pascoe et al. | ............... | 715/524 |
| 5,854,929 A * | 12/1998 | Van Praet et al. | .......... | 717/156 |
| 6,172,990 B1 * | 1/2001 | Deb et al. | ................... | 370/474 |
| 6,778,188 B2 * | 8/2004 | Emberling et al. | ......... | 345/606 |
| 6,825,848 B1 * | 11/2004 | Fu et al. | ..................... | 345/557 |
| 6,892,286 B2 * | 5/2005 | Hangal et al. | .............. | 711/154 |
| 6,925,507 B1 * | 8/2005 | Hersent | ....................... | 710/52 |
| 7,054,989 B2 * | 5/2006 | Mizobata | .................... | 710/316 |
| 7,075,541 B2 * | 7/2006 | Diard | .......................... | 345/505 |
| 2004/0003206 A1 * | 1/2004 | May et al. | .................. | 712/218 |
| 2004/0003376 A1 * | 1/2004 | May et al. | .................. | 717/132 |
| 2004/0128473 A1 * | 7/2004 | May et al. | ..................... | 712/7 |
| 2004/0153813 A1 * | 8/2004 | Swoboda | ..................... | 714/36 |
| 2005/0050252 A1 * | 3/2005 | Kuno | .......................... | 710/100 |
| 2005/0071835 A1 * | 3/2005 | Essick et al. | ............... | 717/161 |
| 2005/0257151 A1 * | 11/2005 | Wu | ............................. | 715/716 |
| 2005/0289621 A1 * | 12/2005 | Mungula | ..................... | 725/100 |

OTHER PUBLICATIONS

Ciricescu et al. "The reconfigurable streaming vector processor", 2003, Microarchitecture, MICRO-36. Proceedings. 36th Annual IEEE/ACM International Symposium on, pp. 141-150.*

(Continued)

*Primary Examiner*—Stacy Whitmore
*Assistant Examiner*—Helen Rossoshek (57) ABSTRACT

A streaming processor circuit of a processing system is automatically generated by selecting a set of circuit parameters consistent with a set of circuit constraints and generating a representation of a candidate streaming processor circuit based upon the set of circuit parameters to execute one or more iterations of a computation specified by a streaming data flow graph. The candidate streaming processor circuit is evaluated with respect to one or more quality metrics and the representation of the candidate streaming processor circuit is output if the candidate streaming processor circuit satisfies a set of processing system constraints and is better in at least one of the one or more quality metrics than other candidate streaming processor circuits.

19 Claims, 7 Drawing Sheets

OTHER PUBLICATIONS

Erez, "Stream architectures—efficiency and programmability", Nov. 16-18, 2004, System-on-Chip, Proceedings, International Symposium on p. 41.*

Buck, "Static scheduling and code generation from dynamic dataflow graphs with integer-valued control streams", Oct. 31-Nov. 2, 1994, Signals, Systems and Computers, Conference Record of the Twenty-Eighth Asilomar Conference on vol. 1, pp. 508-513 vol. 1.*

Callahan, "Kernel formation in Garpcc", Apr. 9-11, 2003, Field-Programmable Custom Computing Machines, FCCM 11th Annual IEEE Symposium on pp. 308-309.*

Serebrin et al., "A stream processor development platform", Sep. 16-18, 2002, Computer Design: VLSI in Computers and Processors, Proceedings. IEEE International Conference on, pp. 303-308.*

Greb et al., "GPU-ABiSort: optimal parallel sorting on stream architectures", Apr. 25-29, 2006, Parallel and Distributed Processing Symposium, IPDPS, 20th International, p. 10 pp.*

Kapas et al., "Programmable stream processors", Aug. 2003, Computer, vol. 36, Issue 8, pp. 54-62.*

Kapas et al., "The Imagine Stream Processor", Sep. 16-18, 2002, Computer Design: VLSI in Computers and Processors, Proceedings. IEEE International Conference on, pp. 282-288.*

Bhattacharyya et al., "Mapping DSP applications onto self-timed multiprocessors", Nov. 2001, Signals, Systems and Computers, Conference Record of the Thirty-Fifth Asilomar Conference on pp. 441-448 vol. 1.*

Govindarajan et al., "A novel framework for multi-rate scheduling in DSP applications", Oct. 25-27, 1993, □□Application-Specific Array Processors, Proceedings., International Conference on, pp. 77-88.*

Chiricescu et al., "RSVP II: a next generation automotive vector processor", Jun. 6-8, 2005, Intelligent Vehicles Symposium, 2005. Proceedings. IEEE, pp. 563-568.*

* cited by examiner

AUTOMATIC GENERATION OF A STREAMING PROCESSOR CIRCUIT

FIELD

This invention relates generally to the field of reconfigurable computing.

BACKGROUND

Traditionally, integrated circuit processors are designed either as general purpose microprocessors or as application specific integrated circuits (ASIC's). A general purpose microprocessor is controlled by a fixed instruction set that allows a user to write computer programs which invoke arbitrary sequences of microprocessor instructions. This provides flexibility, but decreases performance since the circuitry is not optimized for any specific application. An ASIC is designed by describing its structure in terms of circuit primitives such as Boolean gates and registers. The circuit designer arranges the circuit primitives so as to optimize performance for a specific application (such as video compression or audio decoding). While an ASIC provides high performance, its fixed architecture cannot be changed after fabrication to adapt to new algorithms or changing standards. Additionally, the high development costs and lengthy design cycle are not suited to rapidly developing markets.

One approach to reducing the length of the design cycle is the use of automatic design tools that take a specific algorithm and architecture constraints as inputs and produce a design for an integrated circuit. However, this approach does not allow architecture of the integrated circuit to be changed after fabrication.

An alternative approach is the use of reconfigurable hardware. Reconfigurable hardware utilizes programmable logic to provide a degree of reconfigurability in an integrated circuit. An example is a field programmable gate array (FPGA). This approach permits the architecture to be changed after fabrication. However, often it is necessary to reset the hardware whenever the architecture needs to be modified.

A still further approach uses run-time reconfigurable architecture, is which some feature of the architecture can be modified while an application is running. Examples include processors with programmable data paths between computational units.

BRIEF DESCRIPTION OF THE DRAWINGS

The novel features believed characteristic of the invention are set forth in the appended claims. The invention itself, however, and further objects and advantages thereof, will best be understood by reference to the following detailed description of an illustrative embodiment when read in conjunction with the accompanying drawing(s), wherein:

DETAILED DESCRIPTION

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to the generation of streaming reconfigurable architectures. A streaming architecture is one that is designed to process a large amount of ordered data. Typically, the data is stored in a regular memory pattern (such as a vector, a two-dimensional shape, or a linked list) or received in real-time via a buffer. Processing of data streams is common in media applications, such as digital audio and video, and in data communication applications (such as data compression or decompression). In many applications, relatively little processing of each data item is required, but high computation rates are required because of the large amount of data.

When a data item is to be processed, it must be retrieved from a memory. This requires that the memory address of data item be calculated. Care must be taken to avoid memory address aliasing. Also, if the results of the processing are to be written to a memory, the memory address where the result is to be stored must be calculated. These calculations are dependent upon the ordering of the data in memory.

Streaming processors have been developed, in which the calculation of memory addresses is separated from the processing of the data in the hardware of the processor. This is achieved by using input and output stream units. An input stream unit is a circuit that can be programmed to calculate memory addresses for a data stream. In operation the input stream unit retrieves data items from memory in a specified order and presents them consecutively to a processor. Similarly, an output stream unit receives consecutive data items from a processor and stores them in a specified data pattern in a memory.

A data flow graph is a graphical representative of an algorithm, process, or kernel, in which nodes of the graph denote computations and edges of the graph denote data flow or dependencies between computations.

It is known that a data flow graph representation of a kernel may be processed automatically to generate a design for an application specific device or particular reconfigurable devices. However, this approach cannot be used with streaming reconfigurable processors, since in general, the order in which the data is to be processed is not known in advance. Further, the design process is complicated by the need for memory address calculation.

Figure 1:
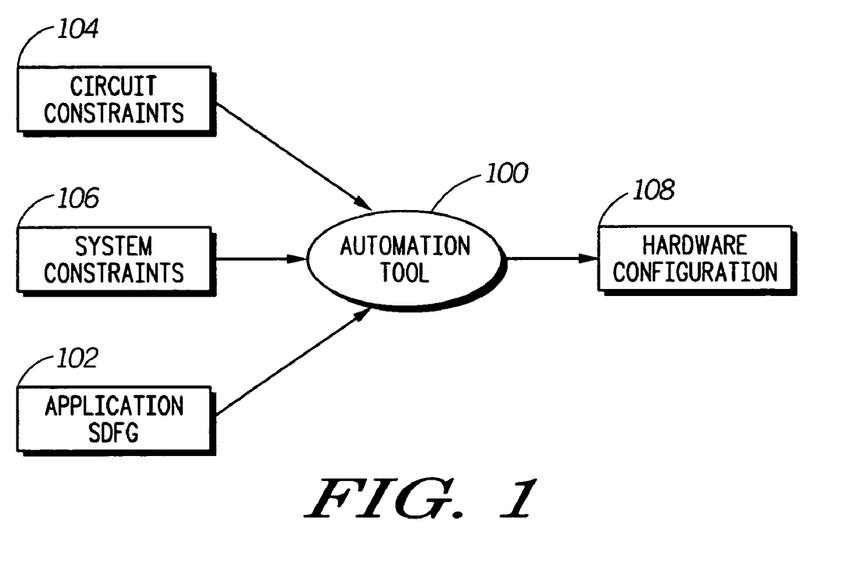
FIG. 1 is diagram of a system for generating a streaming processor architecture in accordance with an embodiment of the invention.

FIG. 1 is a diagram of a system for generating a design of streaming processor circuit in accordance with some embodiments of the present invention. Referring to FIG. 1, an automation tool 100 receives a description 102 of an application or algorithm kernel to be executed on the circuit. The description 102 includes a streaming data flow graph (SDFG) representation of the kernel. An SDFG is a restricted form of a data flow graph and will be described in more detail below. Alternatively, the kernel description may in the form of a high level language description of the algorithm or a data flow graph representation of the algorithm. These descriptions may be reduced to a SDFG representation by the automation tool.

The SDFG may itself be represented as linear formatted code. A linear formatted code is a list of instructions that includes a source instruction for each input of the data flow graph, a computation instruction for each node of the data flow graph and a sink instruction for each output of the data flow graph. Each instruction includes an instruction identifier. The computation instructions comprise a descriptor of the operation performed at the node and the instruction identifier of each instruction that produces an input to the node.

Referring again to FIG. 1, the automation tool 100 also receives descriptions of any circuit constraints 104 and system constraints 106. The circuit constraints 104 are requirements for the reconfigurable circuit to be designed and may include, for example, the maximum number of computation units to be used. The system constraints are limitations of the system to which the reconfigurable circuit will interface. The system constraints may include the memory bandwidth, for example. From the received information, the automation tool 100 generates a description 108 of an integrated circuit (the hardware) for computing the kernel. In one embodiment of the invention, the description 108 takes the form of a register transfer language (RTL) description of the hardware. The RTL description may include references to circuit functional blocks (such as pre-designed computation units).

Figure 2:
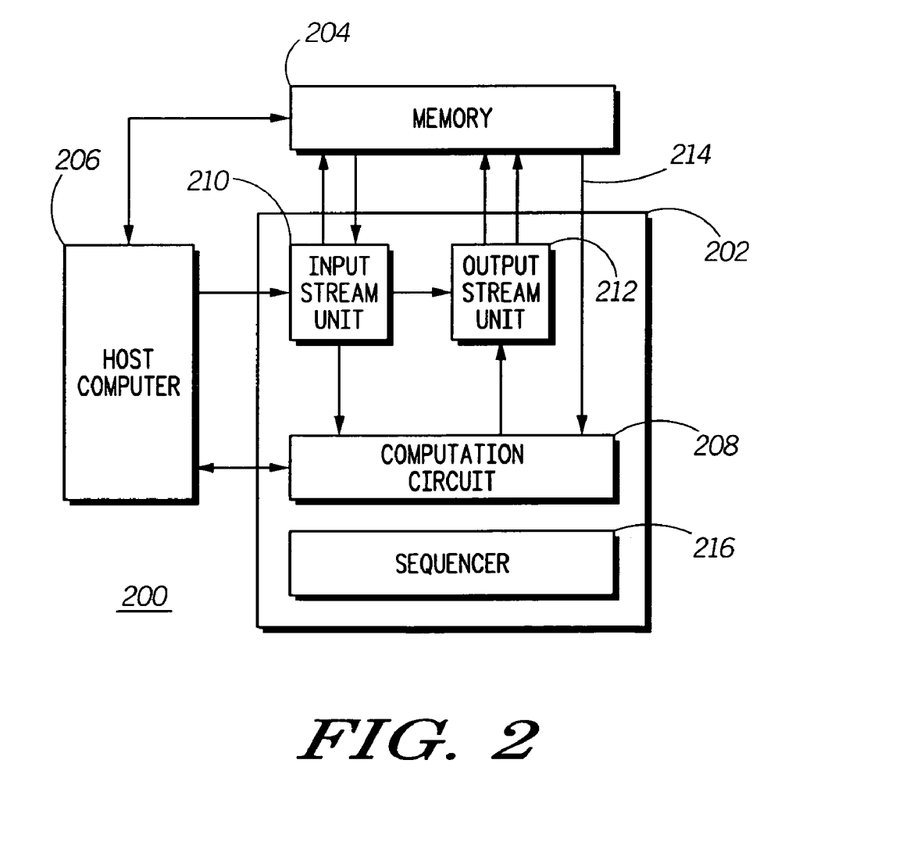
FIG. 2 is a diagram of a processing system including a streaming processor in accordance with an embodiment of the invention.

An example of a processing system including a streaming processor is shown in FIG. 2. Referring to FIG. 2, the processing system 200 comprises a streaming processor 202 that is coupled to a memory 204 and, optionally, to a host computer 206. The streaming processor 202 includes a computation circuit 208 that performs computations on data streams. The data streams are retrieved from the memory 204 by one or more input stream units 210. An input stream unit 210 is operable to generate memory addresses, read data items from the memory 204 and present the data items in a stream to the computation circuit 208. The data streams resulting from the computations are written back into the memory 204 via one or more output stream units 212. An output stream unit 212 is operable to receive a stream of data items from the computation circuit, generate memory addresses and write the received data to the memory 204. Scalar values 214 may also be read from the memory or written to the memory. In some embodiments of the present invention, a host computer provides the memory address of the scalar value. The scalar values may also be written or read by a host computer 206. A sequencer 216 controls operation of the streaming processor 202.

The host computer 206 may be used to write parameters to the stream units that define the pattern in which the data items are stored (or are to be stored) in the memory 204. The host computer 206 may also access data values in the computation circuit 208 that are stored in accumulators or registers, for example. In one embodiment of the invention, the host computer is operable to upload streaming processor circuit configurations to a reconfigurable platform. This may allow the processor architecture to be reset or be reconfigured in real-time.

Figure 3:
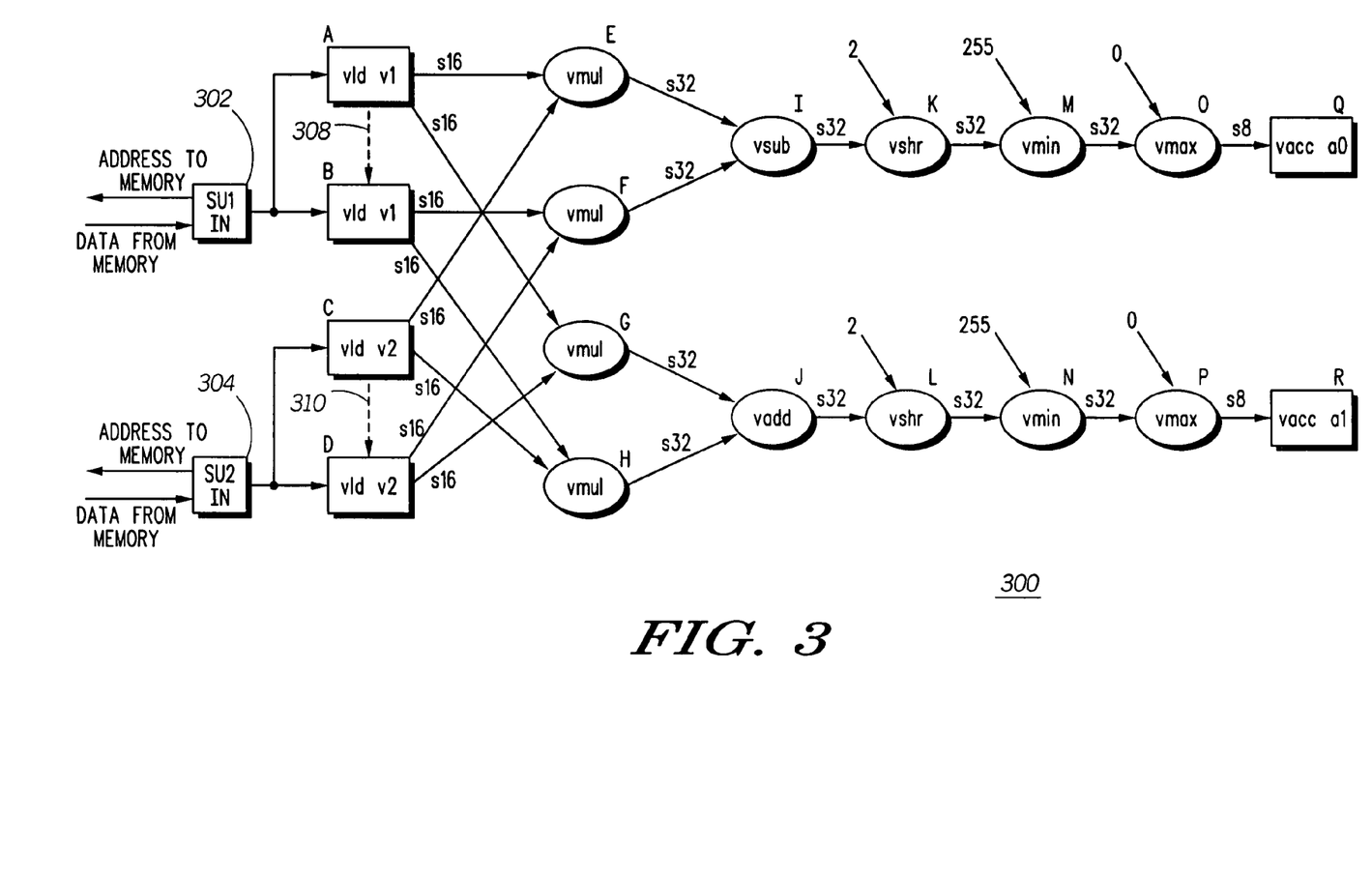
FIG. 3 is an exemplary streaming data flow graph in accordance with an embodiment of the invention.

An exemplary streaming data flow graph (SDFG) is shown in FIG. 3. Referring to FIG. 3, the data-flow graph 300 consists of a number of external interaction blocks, A, B, C, D, Q and R, and a number of computational nodes, E-P. The computational nodes are also referred to as processing nodes or functional nodes. In the SDFG representation, the program flow is determined by the interconnections between the computational nodes and the external interaction blocks.

The order in which parallel paths in the graph are executed is not specified. In FIG. 3, a first value from an input stream unit 302 is loaded at external interaction block A and a second value from the same stream unit is loaded at block B. The order of these two operations is important, so an order dependency is specified in the graph, as indicated by the broken arrow 308. Similarly, consecutive data values from a second input stream unit 304 are loaded at external interaction blocks C and D, the order being indicated by broken arrow 310.

At computational node E, the values loaded at A and B are multiplied (indicated by the mnemonic 'vmul'). The values input as operands to the multiplication are signed, 16-bit values, as indicated by 's16' on the inputs to node E. The output from node E, is similarly indicated as being a signed, 32-bit value ('s32'). At computational node F, the values loaded at B and D are multiplied (indicated by the mnemonic 'vmul'). The values input as operands to the multiplication are signed, 16-bit values, as indicated by 's16' on the arcs connecting blocks A and B to node F. The output from node F is similarly indicated as being a signed, 32-bit value ('s32'). Computational nodes G-O operate similarly, with the mnemonics 'vsub' and 'vadd' indicating subtraction and addition respectively, 'vshr' indicating a right shift, and 'vmin' and 'vmax' denoting minimum and maximum operations, respectively. At external interaction block Q, the result of the maximum operation at node O is accumulated into a named accumulator a0. At external interaction block R, the result of the maximum operation performed at node P is accumulated into the named accumulator a1.

If the first input stream is the interleaved real and imaginary parts of a complex vector x, and the second input stream is the interleaved real and imaginary parts of a complex vector y, then on output the accumulators contain the real and imaginary parts of the dot product of the clipped real and imaginary parts of the inputs.

Table 1 shows a linear formatted code representation of the streaming data flow graph shown in FIG. 3. Each instruction is identified by an instruction descriptor.

TABLE 1

| A | vld (v1) |
|---|----------|
| B | vld (v1) |
| C | vld (v2) |
| D | vld (v2) |
| E | vmul A, C |
| F | vmul B, D |
| G | vmul A, D |
| H | vmul B, C |
| I | vsub E, F |
| J | vadd G, H |
| K | vshr I, 2 |
| L | vshr J, 2 |
| M | vmin K, 255 |
| N | vmin L, 255 |
| O | vmax M, 0 |
| P | vmax N, 0 |
| Q | vacc O, a0 |
| R | vacc P, a1 |

In this example, the corresponding node identifiers from FIG. 3 are used, however, this is not a requirement. The instructions A, B, C and D indicate the loading of vector elements. The linear order of the instructions denotes order dependencies in the data-flow graph representation. Multiplication instruction E includes the mnemonic 'vmul', indicating that the operation is a multiplication, and the operands A and C. This indicates that the operands for the multiplication operation are the results of the operations A and C (the vector load operations). Note that because order dependency is indicated by the linear order of the instructions, the result of vector load A is the first data value in the input vector and the result of vector load B is the second data value in the input vector. At the next iteration of the data-flow graph, these will be the third and fourth values respectively.

The computational instruction E may be written as: E: vmul A, C. This instruction includes the identifier of the instruction ('E'), a descriptor of the operation to be performed ('vmul') and the descriptors of the instructions that produce the operands for the computation ('A' and 'C'). Alternatively, the computational instruction E may be written as: E: vmul.s32A, C. This form of the instruction includes the appended descriptor '.s32', indicating that the result of the operation is a signed, 32-bit value. Other descriptors include 's8', 's16', 's24', 'u8' and 'u16', for example.

The linear formatted code uses references to previous instructions, rather then named registers, to indicate the passing of operation results (data dependencies) within an iteration. The type and size of the result and whether the result is signed or unsigned (the signedness of the result) are indicated by the producing instruction. Results that are passed between iterations are explicitly indicated by instructions that manipulate a set of named registers, called accumulators, and by instructions that manipulate a set of unnamed FIFO (First-In, First-Out) registers called tunnels.

Referring to FIG. 3, instruction Q accumulates the result of instruction O into an accumulator named 'a0'. This named accumulator is used in each iteration and at the start of the iteration it will hold the value from the previous iteration. Accumulator a is used in instruction R.

Thus, each external interaction node and each computational node is represented by an instruction. The instruction comprises an instruction identifier, an instruction mnemonic, and one or more operands. For computational instructions, the operands are the identifiers of the instructions that generate the inputs the computation. For external interactions that produce data (e.g. 'vld') the operand is the source of the data, while for external interactions that receive data (e.g. 'vst', 'vacc') the operands are the destination of the data and the source instruction Data dependencies are explicit, since the operands reference the instructions that generate the data rather than a named storage location. This is illustrated in FIG. 3. Referring to FIG. 3, the data dependencies of the linear formatted code are shown. The arrows point from an instruction to the following instructions that use the output of that instruction. For example, instruction H depends upon data produced by instructions B and C. Thus data dependencies are represented in the format. Operands are indicated as references to an instruction's results, thereby eliminating unnecessary contention for named registers.

Dependencies due to the execution order of instructions that cause changes in state, called order dependencies, are indicated by the serial order of these non-independent instructions in the instruction list. Order dependencies are specified independently of the data dependencies, thereby supporting simultaneous execution of multiple iterations as long as the order of state changes is maintained.

The computation is thus represented as linear formatted code (a sequential instruction list), including a source instruction for each input of the streaming data flow graph, a computational instruction for each node of the data-flow graph and a sink instruction for each output of the data-flow graph. Each instruction includes an instruction identifier, and the computation instruction for a node includes a descriptor of the operation performed at the node and the identifier of each instruction that produces an input to the node. The computational instructions include arithmetic, multiplication and logic instructions. The source instructions include instructions to load data from an input data stream, load a scalar value from a scalar register load a value from an accumulator and retrieve a value from a tunnel. The sink instructions include instructions to add, subtract or store to an accumulator, output to an output data stream or pass to a tunnel.

Tunnels may be used to save a result from an operation in the current iteration while producing the result saved from a previous iteration. Tunnels indicate data flows between consecutive iterations in a graph, where the source and sink of the flow are the same point in the graph. This allows multiple iterations to be executed simultaneously, since data from one iteration can be concurrently passed to the next iteration. Accumulators, described above, cannot do this since their source and sinks are at different points in the data-flow graph.

Figure 4:
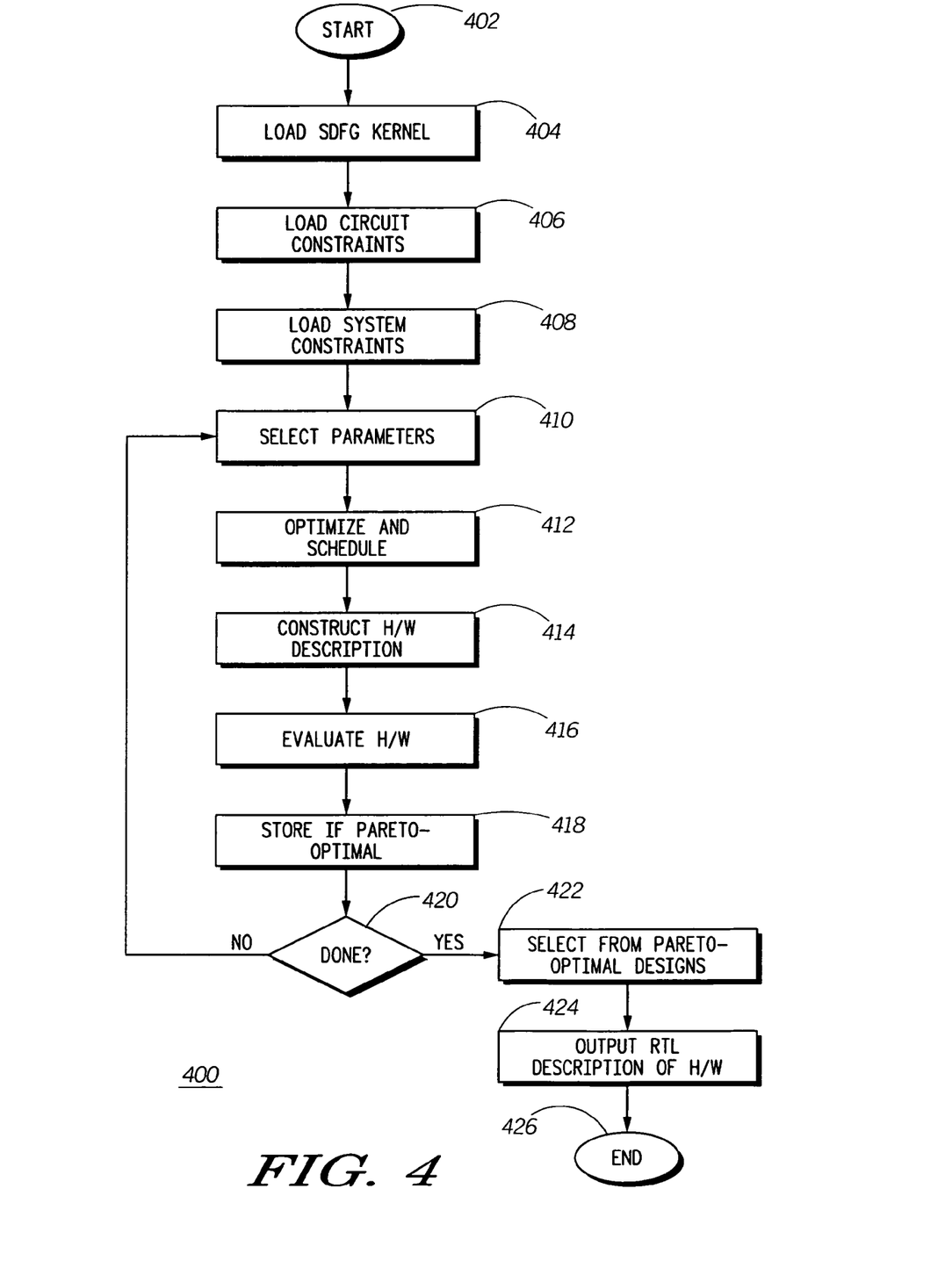
FIG. 4 is flow chart of a method in accordance with an embodiment of the invention.

FIG. 4 is a flow chart of a method 400, in accordance with an embodiment of the invention, for automatic configuration of a streaming processor circuit of a processing system. The method may be performed by an automation tool executed on a computer. Referring to FIG. 4, following start block 402, a streaming data flow graph (SDFG) description of an algorithm kernel is loaded at block 404. At block 406 a set of circuit constraints is loaded. These circuit constraints are related to the streaming processor circuit to be configured and may be set by the user or designer for example. The circuit constraints may include the maximum number of function units of each type (adders, multipliers, shifters etc) to be used in the circuit, the size (bit width) of the function units, and the maximum physical area of the circuit.

At block 408 a set of system constraints are loaded. The system constraints relate to the processing system with which the streaming processor circuit will interact. For example, the processing system may include a memory having a maximum data bandwidth. The streaming processor circuit is constrained to consume or generate data items at a rate no greater than the memory bandwidth. The system constraints may also include the maximum area of the streaming processor circuit.

Blocks 410-420 describe an iterative optimization process. In this process, each iteration instantiates a set of variables (the circuit parameters) in the search space, and attempts to optimize for the remaining variables. At block 410, a set of circuit parameters are selected. These circuit parameters may include the number of function units of each type or the memory bandwidth utilization, for example. At block 412, the streaming data flow graph is optimized and scheduled for a streaming processor circuit having the selected parameters. At block 414, a hardware description of a candidate circuit to implement the streaming data flow graph is generated, using a register transfer language description or other hardware description language description. At block 416, the candidate circuit is evaluated using one or more quality metrics, such as the area of the circuit, the throughput of the circuit, the clock speed of the circuit and/or the latency of the circuit. If the candidate circuit is pareto-optimal relative to previous candidate circuits, the description is stored at block 418.

At decision block 420, a check is made to determine if the design process is completed. The process may be completed when a specified number of candidate circuits have been evaluated, or when a desired quality metric is achieved or when all combinations of circuit parameters have been evaluated. If the design process is not completed, as indicated by the negative branch from decision block 420, flow returns to block 410 and a new set of circuit parameters are selected. If the design process is completed, as indicated by the positive branch from decision block 420, a circuit is selected from the set of pareto-optimal circuits as block 422 and the description of one or more selected circuits is output at block 424 for designer review or output to a reconfigurable processor where the circuit is implemented. The process terminates at block 426.

The selected circuits may be pareto-optimal circuits, that is, circuits that are better than all of the other circuits evaluated in at least one quality metric.

Figure 5:
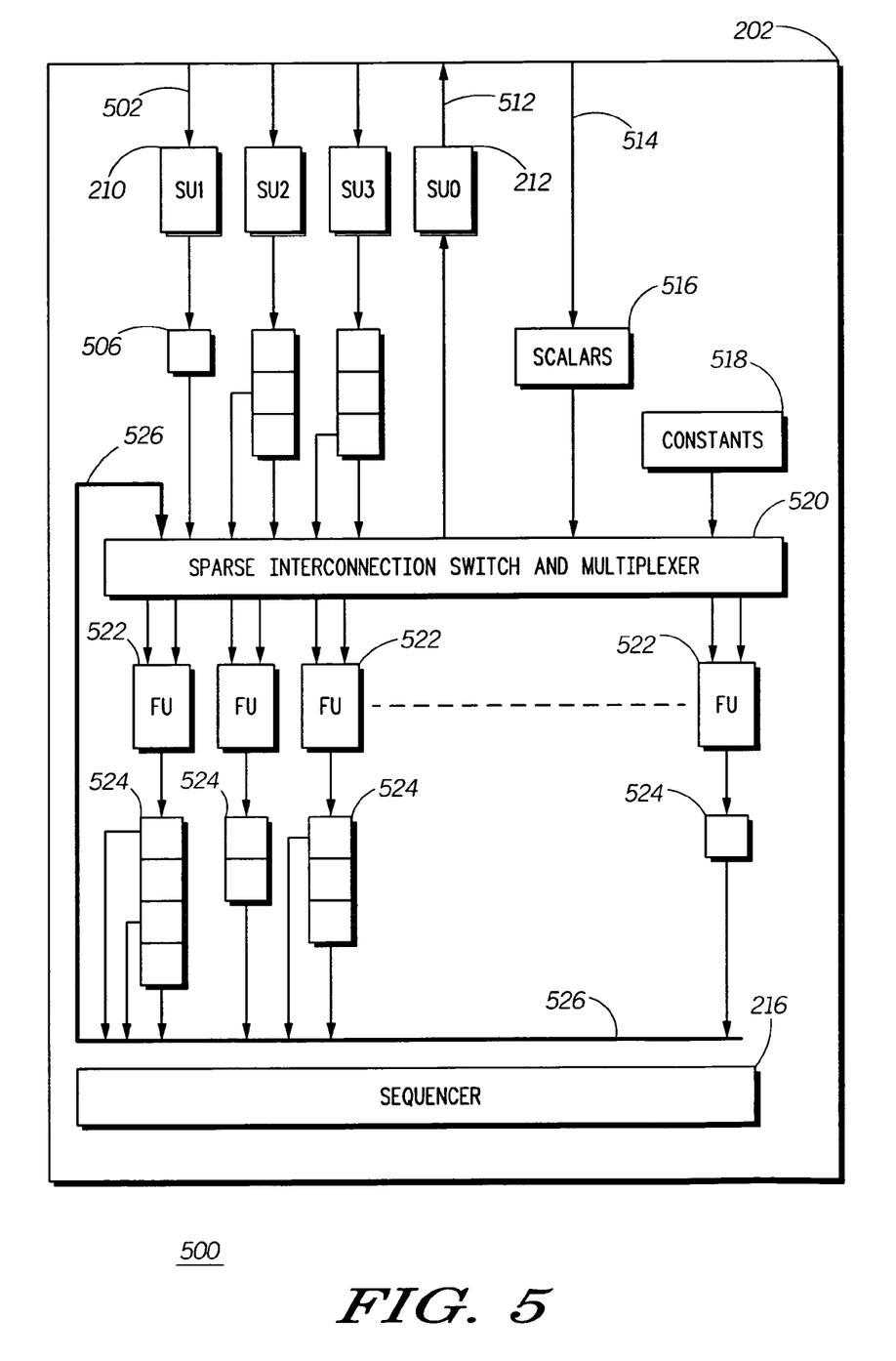
FIG. 5 is a diagram of an exemplary streaming processor in accordance with an embodiment of the invention.

FIG. 5 is a diagram of an exemplary streaming processor in accordance with an embodiment of the invention. Referring to FIG. 5, the streaming processor 202 includes input stream units 210 that generate memory addresses and retrieve data streams 502 from a memory and an output stream unit 212 that generates memory addresses and stores a data stream 512 to a memory. The streaming processor 202 may also retrieve scalar values 514 from a memory and store them in scalar registers 516. The streaming processor 202 may also include constant registers 518 and a sequencer 216. As an alternative to constant registers 518, the constant values may be represented as literals in the reconfigurable architecture and used "as-is" in the computations. Each input stream unit 210 passes the input stream to a stream queue 506 which may be implemented as a delay line having one or more elements.

A sparse interconnection switch and multiplexer 520 is used to provide data paths between the stream units (210, 212) and one or more function units 522. The multiplexer tree 520 is used to provide connections between the outputs of the function units 522 and their inputs. The connection from the output of each function unit 522 includes a stream queue 524 that may be implemented as a delay line having one or more register elements. The number of registers in the stream queue 524 and the connections between the output of some of the registers and the inputs of some of the functional units depend on the schedule of the SDFG. For example, the number of registers elements in a stream queue 524 is equal to the maximum number of cycles that an output variable of the corresponding functional unit 522 is live. For simplicity, the connections between the stream queues 524 and the multiplexer tree 520 are combined and shown as connection 526.

It will be apparent to those of ordinary skill in the art that other streaming processor architectures may be used. For example, the stream queues may be implemented as part of the multiplexer tree 520, or the stream queues may be implemented as simple registers.

In one embodiment of the invention, the streaming processor uses an atomic control unit (hardwired finite state machine) for each function unit. In this embodiment, descriptions of the atomic control units are generated by the automation tool. These atomic control units control the operation of the associated function unit over each iteration cycle. Atomic control units may be used by the function units (including the accumulator) to control the operation and the input operands and by the scalar registers to control the tunneling and the storage of new elements in the scalar registers. Also, atomic control units may be used by the stream queues to control the movement of operands in the queue and by the sequencer (including the accumulator sequencer) to control the amount by which the sequencer should be decremented in every clock cycle. Also, atomic control units may be used to select the inputs of the functional units in every clock cycle.

Alternatively, the streaming processor may use centralized control units that produce signals for all the functional units. For example, a global VLIW (very long instruction word) control may be used in such an embodiment. A global loop counter is used to count the number of iterations as the loop is executed. Additional loop counters may be used for accumulators.

Figure 6:
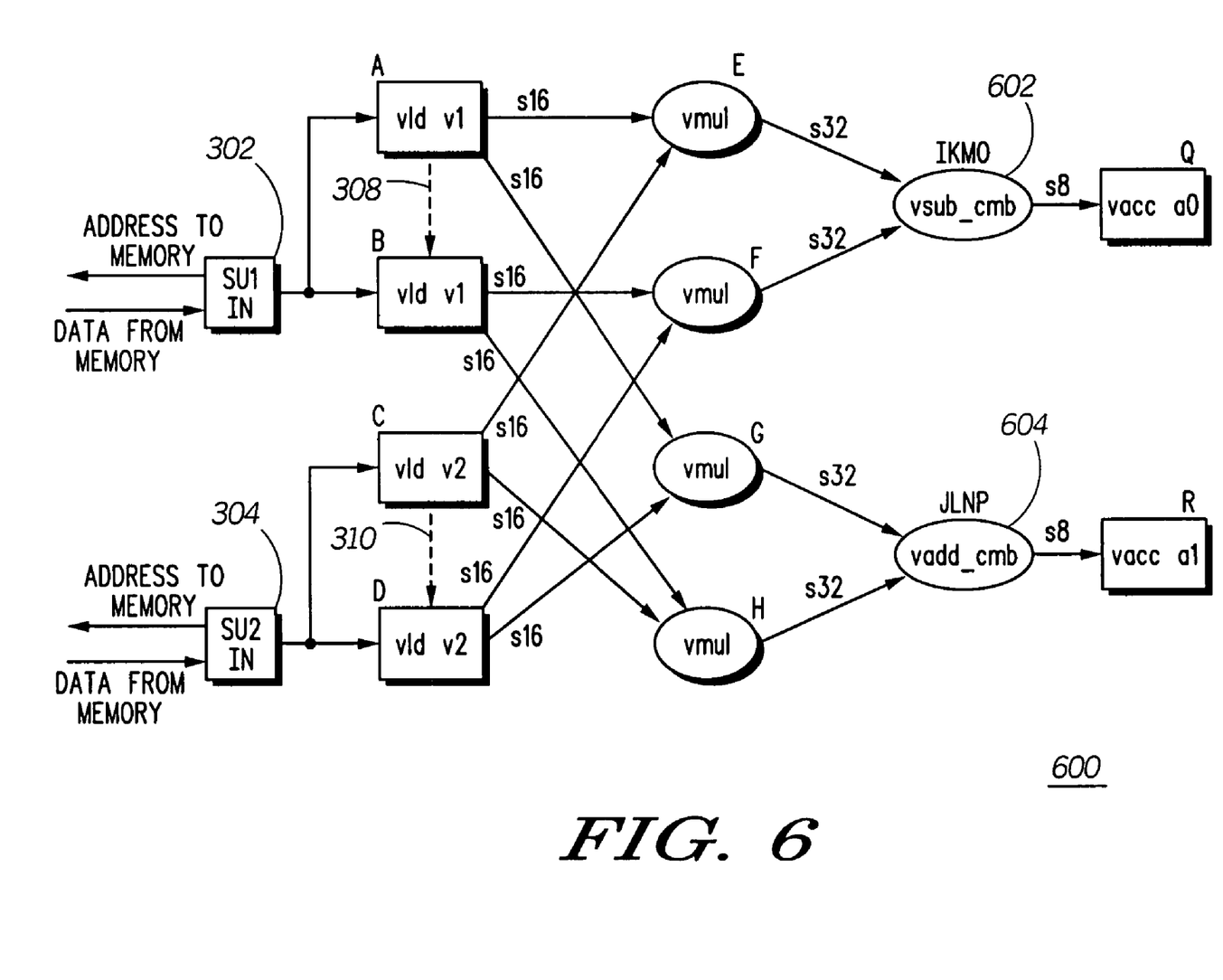
FIG. 6 is an exemplary streaming data flow graph in accordance with an embodiment of the invention.

Atomic control units may also be used to provide combined functions. For example, for the SDFG on FIG. 3, a custom arithmetic logic unit (ALU) may be used to implement an add or subtract operation (or both, or neither), a right shift by 2 operation (or not), and a minimum or maximum operation (or both or neither), provided that the operations are in the specified order. Use of this custom ALU simplifies the SDFG as shown in FIG. 6. In FIG. 6, the operation nodes I, K, M, O have been replaced by a single combined operation node 602, while the operation nodes J, L, N, P have been replaced by a single combined operation node 604. The combination of operations eliminates a lot of interconnects between function units, and can be very helpful in interconnect-limited platforms such as FPGAs A streaming processor may be designed to implement more than one SDFG. In one embodiment of the invention, several SDFGs are merged and a streaming processor is designed to implement the merged SDFGs. This approach is useful, for example, when the SDFGs have a significant number of common elements. A combination of the common elements with the non common elements creates a streaming processor that can implement any of the SDFGs without reconfiguration.

By way of example, we will now consider how a streaming processor configuration may be obtained for the SDFG in FIG. 6. The first step is to load the SDFG into the automation tool. This may be done be entering the linear formatted code of the SDFG or by entering the SDFG graphical via a user interface. Next the system constraints are input. In this example, the maximum memory bandwidth is 8 bytes per cycle. Next, the circuit constraints are input. In this example, the total area of the computation circuit should be less than 1000 units. The properties of the various elements of the streaming processor are given in Table 2.

TABLE 2

|                  | MUL | ALU | ACC | REGISTER | LINK |
|------------------|-----|-----|-----|----------|------|
| Latency (cycles) | 2   | 1   | 1   | 1        | 0    |
| Area (units)     | 8n  | 2n  | n   | n        | 5    |

In Table 2, 'n' denotes the input bit-width of the computational element.

The next step is to schedule the SDFG. For the first iteration of the optimization, the maximum allowed bandwidth of 8 bytes/cycle is used, so that four 16-bit words can be read from memory in a single cycle. The schedule is shown in Table 3.

TABLE 3

|   | SU1    | SU2    | M1 | M2 | M3 | M4 | ALU (SUB) | ALU (ADD) | ADD | ACC |
|---|--------|--------|----|----|----|----|-----------|-----------|-----|-----|
| 1 | A1, B1 | C1, D1 |    |    |    |    |           |           |     |     |
| 2 | A2, B2 | C2, D2 |    |    |    |    |           |           |     |     |
| 3 | A3, B3 | C3, D3 | E1 | F1 | G1 | H1 |           |           |     |     |
| 4 | A4, B4 | C4, D4 | E2 | F2 | G2 | H2 |           |           |     |     |
| 5 | A5, B5 | C5, D5 | E3 | F3 | G3 | H3 |           |           |     |     |
| 6 | A6, B6 | C6, D6 | E4 | F4 | G4 | H4 | IKMO1     | JLNP1     |     |     |

TABLE 3-continued

| | SU1 | SU2 | M1 | M2 | M3 | M4 | ALU (SUB) | ALU (ADD) | ADD | ACC |
|---|---|---|---|---|---|---|---|---|---|---|
| 7 | | | E5 | F5 | G5 | H5 | IKMO2 | JLNP2 | | |
| 8 | | | | | | | IKMO3 | JLNP3 | Q1 | R1 |
| 9 | | | | | | | IKMO4 | JLNP4 | Q2 | R2 |
| 10 | | | | | | | IKMO5 | JLNP5 | Q3 | R3 |

Figure 7:
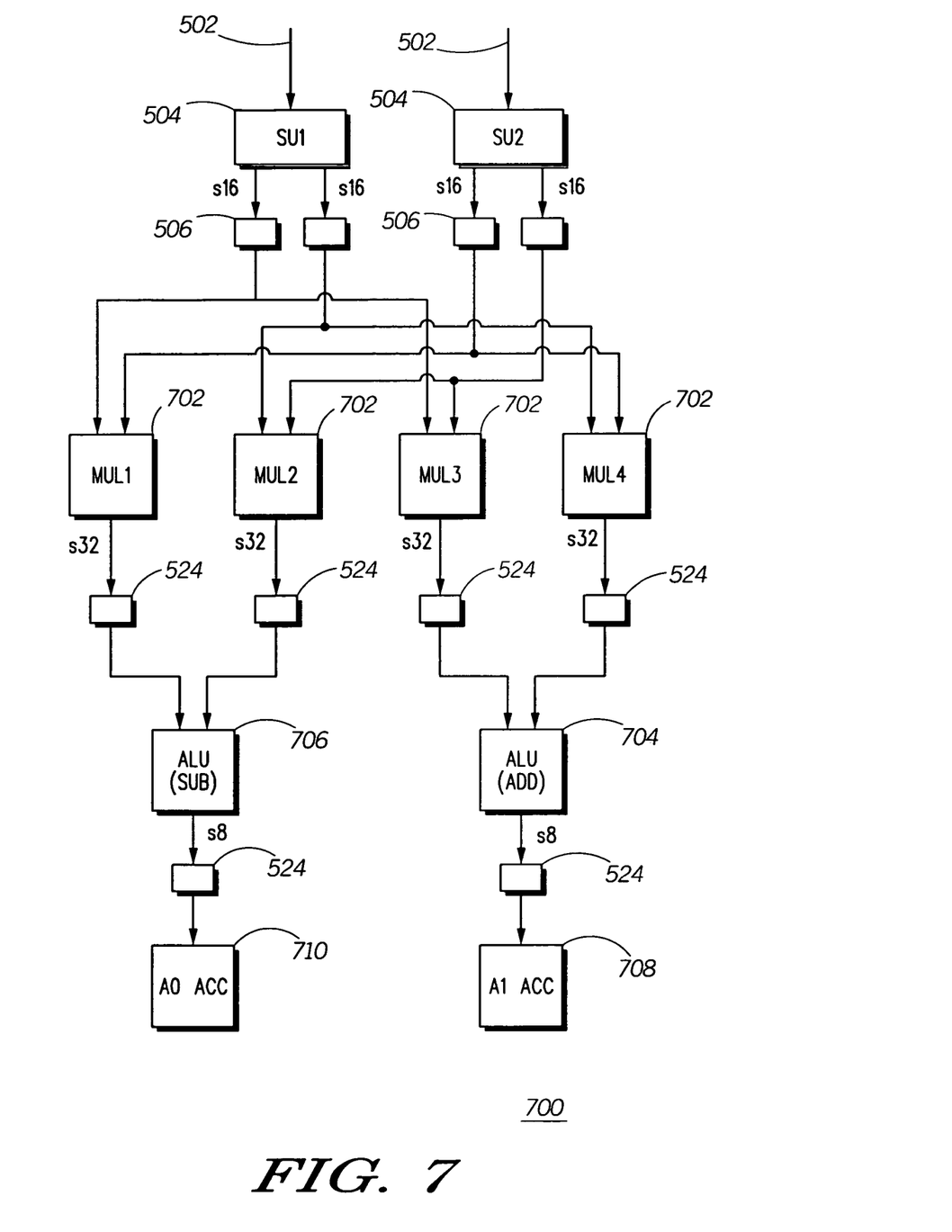
FIG. 7 is a diagram of a first exemplary streaming processor in accordance with an embodiment of the invention.

In Table 3, the number in the left most column denotes the cycle number, and the number to the right of the operation identifier denotes the iteration number. From the scheduled SDFG, a hardware description of a candidate streaming processor is generated as shown in FIG. 7. The candidate streaming processor 700 has two stream units 504 that receive input streams from a memory, four multiplier units 702, a custom add unit 704 (add and clip) and a custom subtract unit 706 (subtract and clip), in correspondence with the scheduled SDFG. The candidate streaming processor has a throughput of 1 output per cycle, and the latency is 9 cycles. The area of the four multiplier units is 4*8*16=512 units. The area of the two ALU units is 2*2*32=128 units. The area of the registers is 4*16+4*32+2*8=208 units, the area of the two 13-bit accumulators is 2*13=26 units, and the area of the 24 interconnects is 24*5=120 units. Thus the total area of the streaming processor is 994, which satisfies the constraint.

The representation of the streaming processor may be at a high level, in which the data path (the computational units and interconnects (stream queues) between them) and the associated controls are specified separately. In the example below (which relates to FIG. 7), the syntax for each function unit is:

fu(name, operation, size, latency), where 'name' is the name of the function unit, 'operation' is a list of the set of operations it can execute, 'size' is the output size in bits, and 'latency' is the delay through the unit. The syntax for each queue or interconnect is:

queue(name, FU name, bit width, no. of registers), where 'name' is the name of the queue, 'FU name' is the name of the function unit to which the queue belongs, 'bit width' is the size of registers in the queue and 'no. of registers' is the number of registers in the queue.

A specification of the data path shown in FIG. 7 is listed below.

```
.DataPathBegin
    // List of FUNCTION UNITS
    fu(Instream1_1, {vld}, {16}, 1);
    fu(Instream1_2, {vld}, {16}, 1);
    fu(Instream2_1, {vld}, {16}, 1);
    fu(Instream2_2, {vld}, {16}, 1);
    fu(mul0, {vmul}, {32, 16, 16}, 2);
    fu(mul1, {vmul}, {32, 16, 16}, 2);
    fu(mul2, {vmul}, {32, 16, 16}, 2);
    fu(mul3, {vmul}, {32, 16, 16}, 2);
    fu(customAdd, {cvadd}, {8, 32, 32}, 1);
    fu(customSub, {cvsub}, {8, 32, 32}, 1);
    fu(acc0, {vacc}, 13);
    fu(acc1, {vacc}, 13);
    // List of QUEUES
    queue(queue1, Instream1_1, 16, 1);
    queue(queue2, Instream1_2, 16, 1);
    queue(queue3, Instream2_1, 16, 1);
    queue(queue4, Instream2_2, 16, 1);
    queue(queue5, mul0, 32, 1);
    queue(queue6, mul1, 32, 1);
    queue(queue7, mul2, 32, 1);
    queue(queue8, mul3, 32, 1);
    queue(queue9, customAdd, 8, 1);
    queue(queue10, customSub, 8, 1);
.DataPathEnd
```

The notations 'vadd', 'vmul', 'vacc' etc. relate to a library model of the corresponding function unit. The library model of an operation may include the cost of the operation and this cost may be accessed by the evaluation tool when evaluating a candidate circuit.

The control path specification provides control information on a per-cycle basis. The syntax for each function unit operation is:

ctl_ops(FU name, list of operations), where 'FU name' is the name of the function unit and 'list of operations' is an ordered list of the operations that are executed in every clock cycle by the function unit, together with the sizes of the input operands and the size of the output. The syntax for specifying the operands to the function units is:

ctl_opnds(FU name, list of queue registers), where 'FU name' is the name of the function unit and 'list of queue registers' is an ordered list of queue registers that provide the inputs to the FU. The syntax for queue control is:

ctl_queue(Queue Name, shift), where 'shift' is an ordered list of 1 or 0 notations to show when to shift a new operand down the register. A specification of the control path for the processor shown in FIG. 7 is listed below.

```
.ControlPathBegin
    // cycles per iteration
    cstep(1)
    // Function unit operation every cycle
    ctl_ops(Instream1_1, {vld.s16});
    ctl_ops(Instream1_2, {vld.s16});
    ctl_ops(Instream2_1, {vld.s16});
    ctl_ops(Instream2_2, {vld.s16});
    ctl_ops(mul0, {vmul.s32.s16.s16});
    ctl_ops(mul1, {vmul.s32.s16.s16});
    ctl_ops(mul2, {vmul.s32.s16.s16});
    ctl_ops(mul3, {vmul.s32.s16});
    ctl_ops(customAdd, {cvadd.s8.s32.s32});
    ctl_ops(customSub, {cvsub.s8.s32.s32});
    ctl_ops(acc0, {vacc.s8});
    ctl_ops(acc1, {vacc.s8});
    // Function unit operands every cycle
    ctl_opnds(mul0.A, {queue1.1});
    ctl_opnds(mul0.B, {queue3.1});
    ctl_opnds(mul1.A, {queue2.1});
    ctl_opnds(mul1.B, {queue4.1});
```

-continued

```
        ctl_opnds(mul2.A, {queue1.1});
        ctl_opnds(mul2.B, {queue4.1});
        ctl_opnds(mul3.A, {queue2.1});
        ctl_opnds(mul3.B, {queue3.1});
        ctl_opnds(customSub.A, {queue5.1});
        ctl_opnds(customSub.B, {queue6.1});
        ctl_opnds(customAdd.A, {queue7});
        ctl_opnds(customAdd.B, {queue8});
        ctl_opnds(acc0, {queue9});
        ctl_opnds(acc1, {queue10});
        // Queue operation every cycle
        ctl_queue(queue1, {1});
        ctl_queue(queue2, {1});
        ctl_queue(queue3, {1});
        ctl_queue(queue4, {1});
        ctl_queue(queue5, {1});
        ctl_queue(queue6, {1});
        ctl_queue(queue7, {1});
        ctl_queue(queue8, {1});
        ctl_queue(queue9, {1});
        ctl_queue(queue10, {1});
    .ControlPathEnd
```

We now return to the optimization of the streaming processor configuration. For the next iteration, the maximum allowed bandwidth of 4 bytes/cycle is used. The schedule is shown in Table 4.

TABLE 4

| | SU1 | SU2 | MUL1 | MUL2 | CUSTOM ALU | ACC 0 | ACC 1 |
|---|---|---|---|---|---|---|---|
| 1 | A1 | C1 | | | | | |
| 2 | B1 | D1 | | | | | |
| 3 | A2 | C2 | E1 | | | | |
| 4 | B2 | D2 | F1 | G1 | | | |
| 5 | | | E2 | H1 | | | |
| 6 | | | F2 | G2 | | | |
| 7 | | | E3 | H2 | IKMO1 | | |
| 8 | | | F3 | G3 | JLNP1 | | |
| 9 | | | E4 | H3 | IKMO2 | Q1 | |
| 10 | | | F4 | G4 | JLNP2 | | R1 |
| 11 | | | | H4 | IKMO3 | Q2 | |
| 12 | | | | | JLNP3 | | R2 |

The throughput is 0.5 outputs per cycle, and the latency is 10 cycles. The area of the two multiplier units is 2*8*16=256 units. The area of the custom ALU unit is 1*2*32=64 units. The area of the registers is 4*16+4*32+1*8=200 units, the area of the two 13-bit accumulators is 2*13=26 units, and the area of the 14 interconnects is 12*5=60 units. Thus the total area of the streaming processor is 606 units, which satisfies the area constraint.

Figure 8:
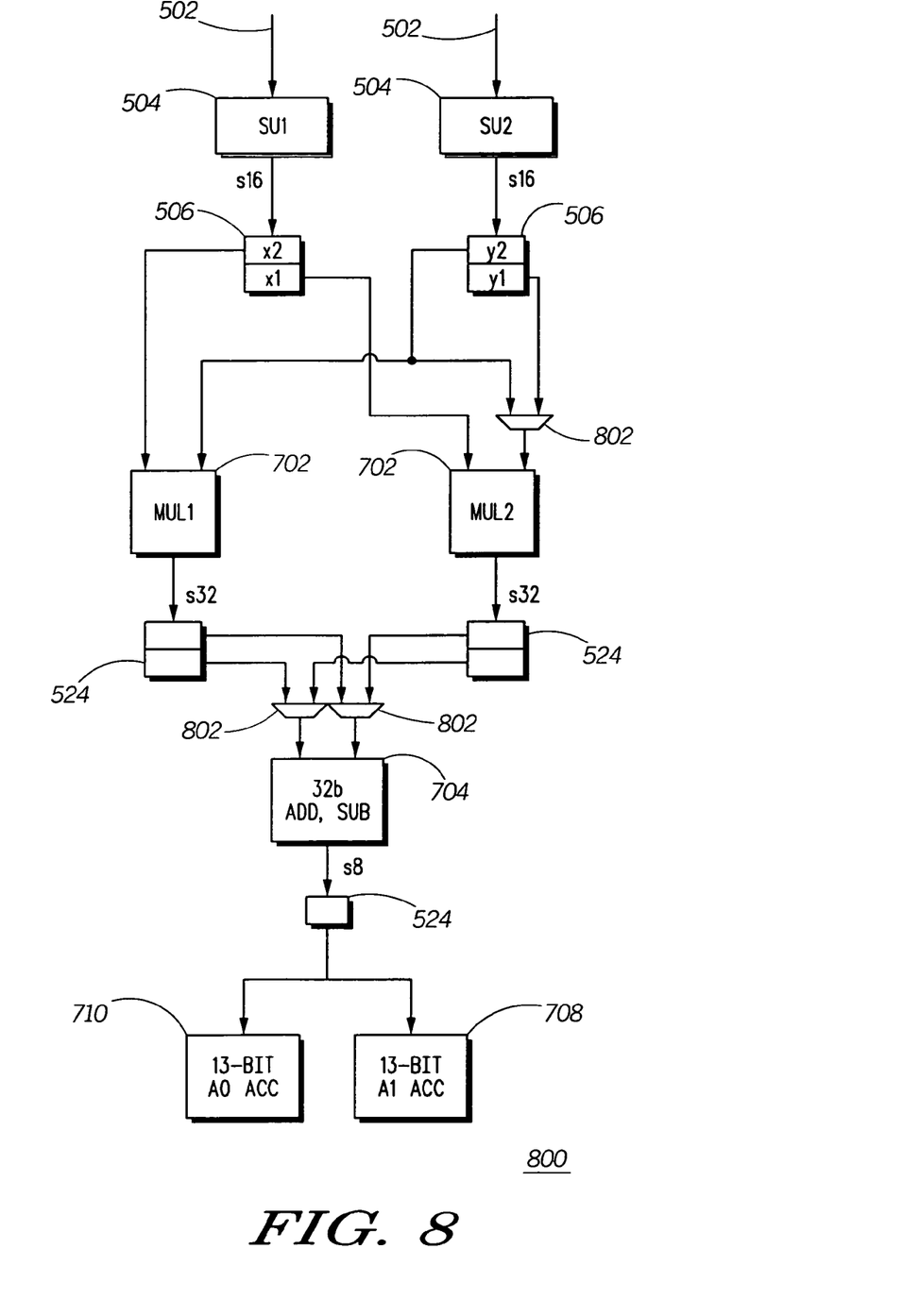
FIG. 8 is a diagram of a second exemplary streaming processor in accordance with an embodiment of the invention.

The corresponding candidate streaming processor is shown in FIG. 8. Referring to FIG. 8, the streaming processor 800 includes multipliers 702, custom ALU unit 704, and accumulators 708 and 710. Multiplexers 802 are used to select between the elements of the queues 506.

The first candidate design, shown in FIG. 7, provides the best throughput, while the candidate design, shown in FIG. 8, yields the smallest area, so both are pareto-optimal in this simple example. The designer can select between the pareto-optimal designs, or the selection can be made automatically based upon a hierarchy of metrics.

The selected design may be used to configure an ASIC or a reconfigurable streaming processor. In one embodiment of the invention, the streaming processor is configured after fabrication, but before operation. In other embodiment, the processor is reconfigured during operation. In a still further embodiment, the processor is configured before fabrication.

The automation tool, as described in embodiments herein, is implemented using a programmed processor executing programming instructions that are broadly described above in flow chart form that can be stored on any suitable electronic storage medium. However, those skilled in the art will appreciate that the processes described above can be implemented in any number of variations and in many suitable programming languages without departing from the present invention. For example, the order of certain operations carried out can often be varied, additional operations can be added or operations can be deleted without departing from the invention. Error trapping can be added and/or enhanced and variations can be made in user interface and information presentation without departing from the present invention. Such variations are contemplated and considered equivalent.

Those skilled in the art will also appreciate that the program steps and associated data used to implement the embodiments described above can be implemented using disc storage as well as other forms of storage, such as, for example, Read Only Memory (ROM) devices, Random Access Memory (RAM) devices, optical storage elements, magnetic storage elements, magneto-optical storage elements, flash memory, core memory and/or other equivalent storage technologies without departing from the present invention. Such alternative storage devices should be considered equivalents.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method for automatic generation of a streaming processor circuit of a processing system, the method comprising:
    selecting a set of circuit parameters consistent with a set of circuit constraints;
    generating a representation of a candidate streaming processor circuit, based upon the set of circuit parameters, to execute one or more iterations of a computation specified by a streaming data flow graph;
    evaluating the candidate streaming processor circuit with respect to one or more quality metrics; and
    outputting the representation of the candidate streaming processor circuit when the candidate streaming processor circuit satisfies a set of processing system constraints and is better in at least one of the one or more quality metrics than other candidate streaming processor circuits,
    wherein the streaming data flow graph comprises a data flow graph having no data-dependent or dynamic memory address generation, no global memory read or write operations, and no recursion.

2. The method in accordance with claim 1, wherein the streaming data flow graph receives, as input, streaming data and an iteration value, and generates streaming data as output.

3. The method in accordance with claim 1, wherein the streaming data flow graph receives one or more scalar values as input and generates one or more scalar values as output.

4. The method in accordance with claim 1, wherein generating a representation of a candidate streaming processor circuit comprises:

scheduling the streaming data flow graph; and generating at least one function unit in the representation for each type of computation instruction in the scheduled streaming data flow graph.

5. The method in accordance with claim 1, wherein generating a representation of a candidate streaming processor circuit comprises:

scheduling the streaming data flow graph; and generating a scalar register in the representation for each scalar and tunnel notation in the scheduled streaming data flow graph.

6. The method in accordance with claim 1, wherein generating a representation of a candidate streaming processor circuit comprises:

generating a schedule for the streaming data flow graph; and generating interconnection links in the representation in accordance with the schedule of the streaming data flow graph.

7. The method in accordance with claim 1, wherein the representation of the candidate streaming processor circuit is a register transfer language representation.

8. The method in accordance with claim 1, wherein the representation of the candidate streaming processor circuit utilizes a model library of function elements and interconnection links.

9. The method in accordance with claim 1, wherein the method is repeated to generate a set of representations of pareto-optimal streaming processor circuits that satisfy the set of processing system constraints and are better in at least one of the one or more quality metrics than other candidate streaming processor circuits.

10. The method in accordance with claim 1, wherein a quality metric of the one or more quality metrics is a metric selected from the group consisting of the area of the candidate streaming processor circuit, the throughput of the candidate streaming processor circuit and the clock speed of the candidate streaming processor circuit.

11. The method in accordance with claim 1, wherein the set of processing system constraints includes a constraint selected from the group consisting of the maximum area of the streaming processor circuit, the latency of the circuit and the power dissipation of the circuit.

12. The method in accordance with claim 1, wherein the set of processing system constraints includes the maximum rate at which data can be transferred between the streaming processor and a memory to which the streaming processor is to be coupled.

13. The method in accordance with claim 1, wherein the set of circuit constraints includes a maximum area of the streaming processor circuit.

14. The method in accordance with claim 1, wherein the streaming processor circuit comprises a plurality of function units and wherein the set of circuit constraints includes the maximum number of function units and the size of the function units.

15. The method in accordance with claim 1, wherein the streaming processor circuit comprises a plurality of function units and wherein the set of circuit parameters comprise includes the maximum number of function units of each type.

16. The method in accordance with claim 1, wherein the representation of the candidate streaming processor circuit that is output by the outputting of the representation comprises:

a representation of a plurality of function units, each function unit of the plurality of function units having an output and a stream queue at its output;

a representation of interconnections between the plurality of function units; and a representation of a plurality of finite state machine controllers, each finite state machine controller associated with the operation of a function unit, the stream queue of a function unit, or the operands of a function unit.

17. The method in accordance with claim 1, wherein the representation of the candidate streaming processor circuit that is output by the outputting of the representation comprises:

a representation of a plurality of function units, each function unit of the plurality of function units having an output and a stream queue at its output;

a representation of interconnections between the plurality of function units; and a representation of a centralized control unit operable to control the operation of the plurality of function, the stream queues of the plurality of function units, and the operands of the plurality of function units.

18. A computer readable medium for storing a set of program instructions which, when executed on a computer, generate a streaming processor circuit of a processing system, the program instructions comprising:

a set of instructions for inputting a streaming data flow graph representation of a computation;

a set of instructions for inputting set of circuit constraints;

a set of instructions for inputting set of processor system constraints;

a set of instructions for selecting a set of circuit parameters consistent with the set of circuit constraints;

a set of instructions for generating a representation of a candidate streaming processor circuit optimized based upon the set of circuit parameters to execute one or more iterations of a computation specified by a streaming data flow graph;

a set of instructions for evaluating the candidate streaming processor circuit with respect to one or more quality metrics; and a set of instructions for outputting the representation of the candidate streaming processor circuit if the candidate streaming processor circuit satisfies the set of processing system constraints and is better in at least one of the one or more quality metrics than other candidate streaming processor circuits.

19. The computer readable medium in accordance with claim 18, wherein the streaming data flow graph comprises a data flow graph having no data-dependent or dynamic memory address generation, no global memory read or write operations, and no recursion.

* * * * *

UNITED STATES PATENT AND TRADEMARK OFFICE
CERTIFICATE OF CORRECTION

PATENT NO. : 7,305,649 B2 Page 1 of 1
APPLICATION NO. : 11/109915
DATED : December 4, 2007
INVENTOR(S) : Nikos Bellas et al.

It is certified that error appears in the above-identified patent and that said Letters Patent is hereby corrected as shown below:

Column 5, Line 29, after "Accumulator" delete "a" and insert -- a1 --, therefor.

Column 11, Line 57, insert -- second --, before "candidate".

Signed and Sealed this

Sixteenth Day of June, 2009

JOHN DOLL
*Acting Director of the United States Patent and Trademark Office*